United States Patent [19]

Sigmon

[11] Patent Number: 5,087,895
[45] Date of Patent: Feb. 11, 1992

[54] MINIATURE MICROSTRIP/CAVITY OSCILLATOR

[75] Inventor: Bernard E. Sigmon, Tempe, Ariz.
[73] Assignee: Motorola, Inc., Schaumburg, Ill.
[21] Appl. No.: 151,341
[22] Filed: Feb. 2, 1988
[51] Int. Cl.$^5$ .................................. H03B 5/18
[52] U.S. Cl. .................. 331/96; 331/117 D; 331/117 FE
[58] Field of Search ............ 331/96, 101, 107 DP, 331/107 SL, 107 C, 117 D

[56] References Cited

U.S. PATENT DOCUMENTS

| | | | |
|---|---|---|---|
| 3,708,761 | 1/1973 | Havens | 331/107 C |
| 3,714,606 | 1/1973 | Friend | 331/107 DP |
| 3,913,035 | 10/1975 | Havens | 331/107 R |
| 4,011,527 | 3/1977 | Havens | 331/117 D |
| 4,162,458 | 7/1979 | Dydyk et al. | 331/56 |
| 4,591,806 | 5/1986 | Havens | 331/96 |
| 4,691,179 | 9/1987 | Blum et al. | 333/202 |

Primary Examiner—Siegfried H. Grimm
Attorney, Agent, or Firm—Frank J. Bogacz; Jordan C. Powell

[57] ABSTRACT

A miniature microstrip/cavity oscillator which is mechanically tunable over a wide range of microwave frequencies and maintains high frequency stability over changes in temperature. The oscillator consists of a RF (resonant frequency) determining element, a microstrip circuit board means, and a capacitive coupling probe coupling the microstrip circuit board means to the RF determining element. The RF determining element is constructed of various materials with different coefficients of linear expansion to eliminate expansion and contraction effects due to temperature changes.

3 Claims, 3 Drawing Sheets

MINIATURE MICROSTRIP/CAVITY OSCILLATOR

BACKGROUND OF THE INVENTION

This invention relates, in general, to oscillators operating at microwave frequencies, and more particularly to miniature oscillators which are mechanically tunable over wide bands of microwave frequencies and which maintain a high degree of frequency stability over changes in temperature.

Often, microwave oscillators utilize cavities for resonant frequency determinants. Prior art cavity oscillators generally have relatively high Q (series resonant quality factor) values and are often temperature compensated. However, since the active elements of these oscillators are often an integral part of the cavity, the oscillators are relatively large. Frequently the frequency output of such oscillators is small, on the order of 1.5 GHz, and expensive multipliers are required to increase the output to the desired frequency Space limitations have been a major detriment to the use of such cavity oscillators.

Some oscillators have been designed with space limitations in mind, such as microstrip oscillators and microstrip oscillators with dielectrics. Although microstrip oscillators with dielectrics have high Q values, they are incapable of mechanical tuning over a wide tuning range. Microstrip oscillators without dielectrics have low Q values as well as limited tuning ranges.

Attempts within the prior art to develope a miniature wide range mechanically tuned microwave oscillator with high Q values capable of maintaining frequency stability over changes in temperature have been unsuccessful. Oscillators designed for frequencies below the microwave range incorporate crystals as the resonant frequency determining element in order to obtain the above specifications. However, crystals do not operate at microwave frequencies, and the prior art has not provided a substitute therefor.

SUMMARY OF THE INVENTION

One purpose of this invention is to provide a miniature microwave oscillator which provides relatively high Q values, wide tuning capabilities in the microwave range, and high frequency stability over changes in temperature. Such a miniature oscillator could be on the order of 0.2 cubic inches To satisfy these requirements, the present invention contemplates coupling a coaxial cavity with a microstrip circuit board. The housing elements of the cavity are comprised of materials with different coefficients of linear expansion to overcome expansion and contraction of the elements due to temperature changes Use of the microstrip circuit board allows the oscillator to be incorporated in a single miniature unit.

It is, therefore, an object of the present invention to provide a miniature, inexpensive microwave oscillator which can be mechanically tuned over a wide range of microwave frequencies.

Another object of the present invention is to provide a wide range mechanically tuned microwave oscillator incorporating a resonant frequency determining element which compensates for changes in temperature to maintain frequency stability.

Other objects and advantages of the present invention will become apparent from the following detailed description, particularly when considered in conjunction with the accompanying drawings.

DETAILED DESCRIPTION OF THE PREFERRED EMBODIMENTS

Throughout the specification and the appended claims, references to Field Effect Transistor, hereinafter referred to as "FET", refers only to a FET which is continuously "on." "INVAR", as used in the specification and claims, refers to a very temperature stable metallic compound frequently used in temperature compensated oscillators and is a registered trademark of Societe Des Forges Et Ateliers Du Creusot.

Figure 1:
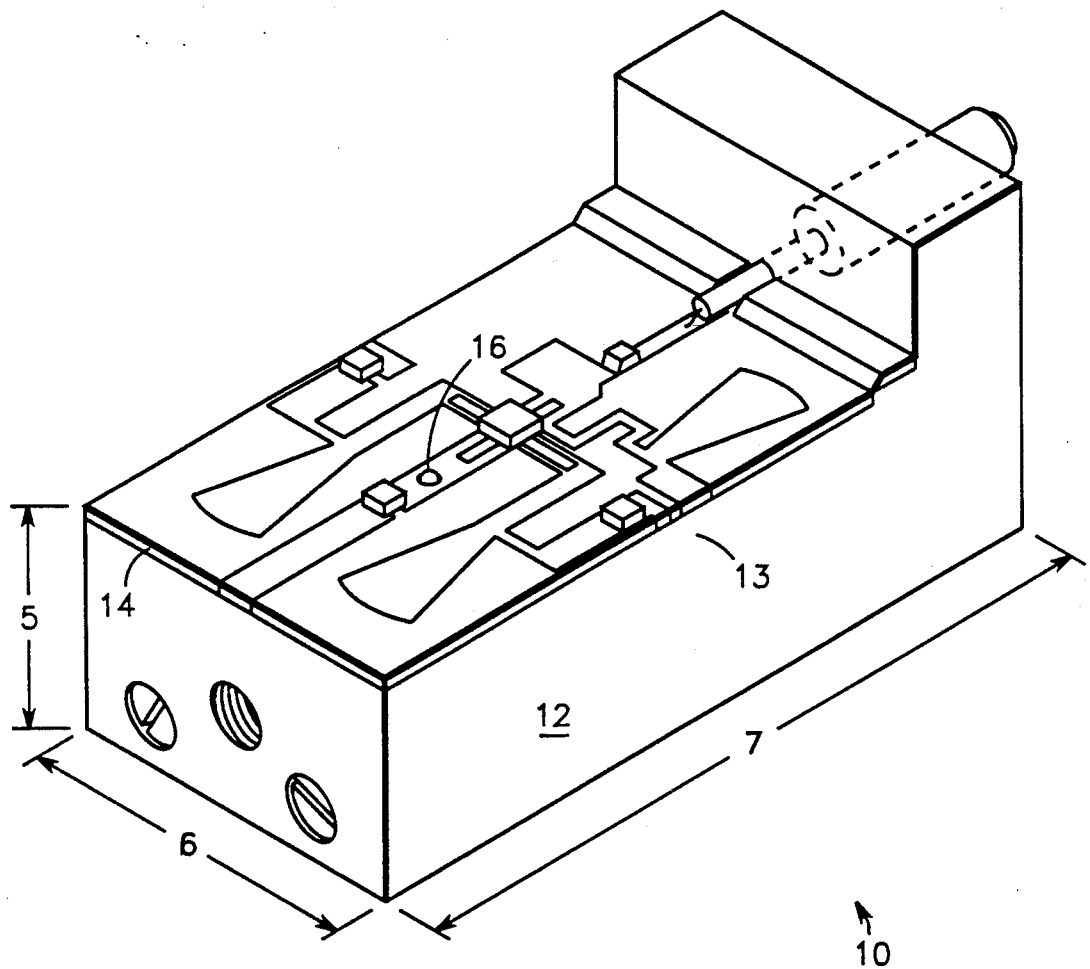
FIG. 1 is an isometric view of a miniature microstrip/cavity oscillator in accordance with the present invention.

A miniature microstrip/cavity oscillator 10, shown in FIG. 1, comprises RF (resonant frequency) determining element 12 with a top portion 13, microstrip circuit board 14 fixedly attached to top portion 13 of RF determining element 12, and capacitive coupling probe 16 (further shown in FIG. 3) which couples RF determining element 12 with microstrip circuit board 14. Oscillator 10, in its preferred embodiment, has height 5 of 0.5 inches, width 6 of 0.5 inches, and length 7 of 0.8 inches.

Figure 2:
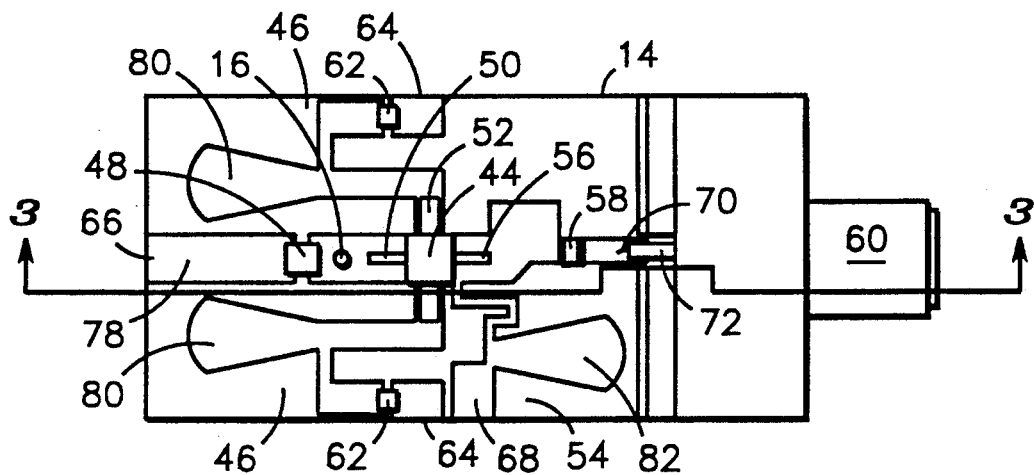
FIG. 2 is a top view of the oscillator in accordance with the present invention showing the circuitry of the microstrip circuit board.

When oscillator 10 is operating, the microstrip circuit on board 14 supplies positive feedback to RF determining element 12, amplifies resonant frequencies obtained from RF determining element 12, and eliminates unwanted stable resonant frequencies. Microstrip circuit board 14, as shown in FIG. 2, generally comprises FET 44 having gate 50, source 52, and drain 56, RF (resonant frequency) choke 46 coupled to source 52, stabilization resistor 48 (50 ohm resistor in its preferred embodiment) connected in series with stabilization quarter-wave line 78 and coupled to gate 50, DC bias 54 coupled to drain 56, dielectric base 84 and metallic subbase 86 (both shown in FIG. 3), and DC blocking capacitor 58 (capacitance of 3 to 5 picoFarads (pF) in its preferred embodiment) coupled to drain 56. DC blocking capacitor 58 is connected to output connector 60 (shown in FIGS. 3 and 4) by connecting line 70 (also shown in FIG. 3). Connecting line 70 is connected to pin 72 of output 60. Output connector 60, in its preferred embodiment, is threaded into output threaded bore 92 to secure output connector 60 to RF determining element 12.

RF choke 46 comprises RFC (resonant frequency choke) quarter-wave line 80 coupled to source resistor 62 and grounded to metallic subbase 86 at ground point 64. One with ordinary skill in the art will recognize that microstrip circuit board 14 may have more than one RF choke 46 with accompanying elements For instance, in its preferred embodiment, microstrip circuit board 14 incorporates dual RF choke 46, but more or less than this number is contemplated by and within the scope of the present invention. Stabilization quarter-wave line 78 is grounded to metallic subbase 86 at stabilization ground 66. DC bias 54 comprises bias point 68 and bias quarter-wave line 82. DC bias 54 and RF choke 46 operate together to bias FET 44.

Figure 3:
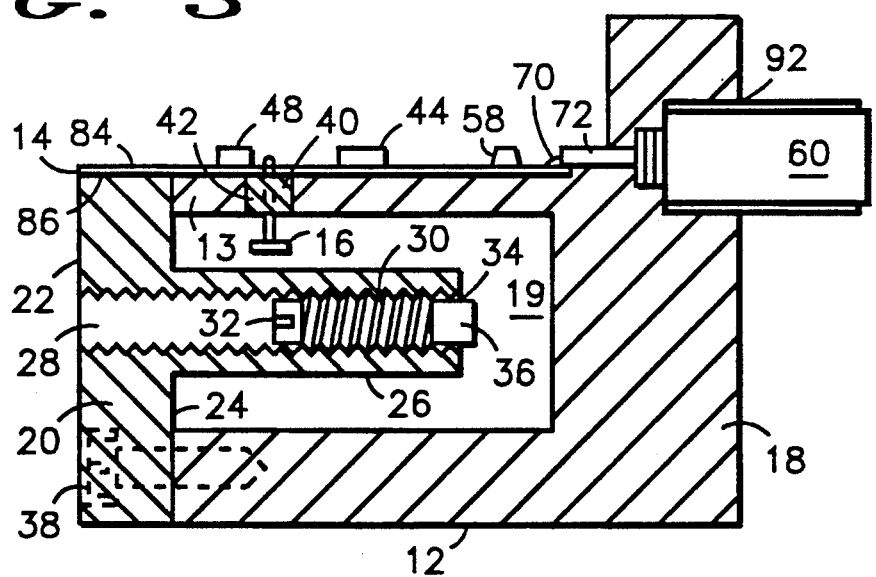
FIG. 3 is a sectional view of the oscillator in accordance with the present invention along line 3—3 of FIG. 2.
Figure 4:
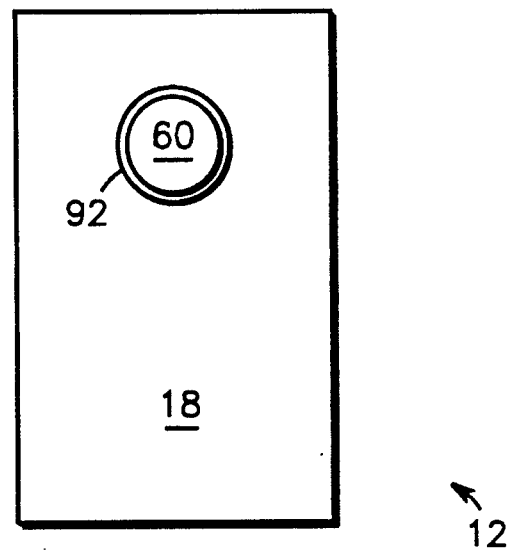
FIG. 4 is a rear view of the oscillator in accordance with the present invention.

A sectional side view of oscillator 10 shown in FIG. 3 shows the various components of RF determining element 12 in its preferred embodiment. In particular, RF determining element 12 comprises housing member 18 which is substantially hollow and forms cavity 19, plate 20 having an outer face 22 and an inner face 24, cantilever member 26 fixedly secured on the center of inner face 24 and extending outward in a cantilever fashion, threaded bore 28 extending concentrically through cantilever member 26 and plate 20, fastening means 38 for removably securing plate 20 to housing member 18, and mechanical tuning screw 30 inserted into and engaging threaded bore 28. Mechanical tuning screw 30 comprises slotted end 32 for mechanically adjusting mechanical tuning screw 30 within threaded bore 28, and opposite end 34 wherein center conductor 36 is fixedly attached. Fastening means 38, in its preferred embodiment, is a bolt as shown in FIG. 3.

During operation of oscillator 10, plate 20 is removably sealed to housing member 18 by fastening means 38. Cantilever member 26 extends into cavity 19 such that center conductor 36 may be extended into cavity 19 or retracted back into threaded bore 28. By extending and retracting center conductor 36, oscillator 10 may be tuned to a desired resonant frequency.

Capacitive coupling probe 16 is suspended into cavity 19 through aperture 40 located in top portion 13 of RF determining element 12. Dielectric probe insulator 42 supports capacitive coupling probe 16 within aperture 40 and insulates capacitive coupling probe 16 from housing member 18.

RF determining element 12 is constructed of a plurality of materials with different coefficients of linear expansion. When RF determining element 12 is constructed of appropriate materials, expansions and contractions of the plurality of materials of RF determining element 12 expand and contract in such a manner as to maintain a substantially constant volume within cavity 19. This maintains stable resonant frequencies within RF determining element 12 over changes in temperature.

The components of RF determining element 12, in their preferred embodiments, are constructed of the following materials:

housing member 18 and plate 20 are constructed of aluminum which has a coefficient of linear expansion of 27 parts per million per degree centigrade (ppm/° C.).

center conductor 36 is constructed of brass which has a coefficient of linear expansion of 19 ppm/° C.; and mechanical tuning screw 30 is constructed of a nickel alloy known in the art as "INVAR". "INVAR" which is generally composed of nickle and iron and has a coefficient of linear expansion of 1 ppm/° C. Although these materials are utilized in the preferred embodiment, one with ordinary skill in the art will recognize that other combinations of materials, including materials with other coefficients of linear expansion, are contemplated by and are within the scope of the present invention.

Figure 5:
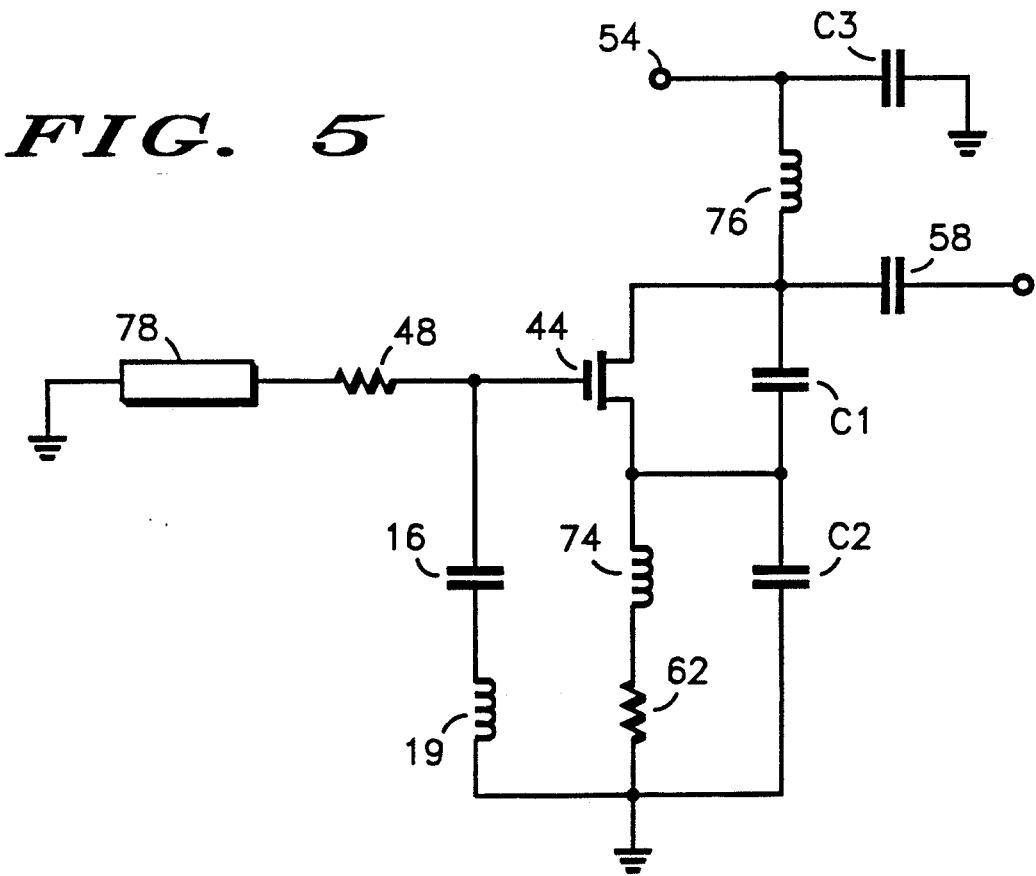
FIG. 5 is a schematic diagram of a microstrip/cavity oscillator in accordance with the present invention.

Oscillator 10 operates generally as a modified Colpitts oscillator as shown in FIG. 5. In operation, a positive feedback signal created by FET capacitance C1 and RFC capacitance C2 is fed from FET 44 to cavity 19 via capacitive coupling probe 16. Cavity 19 and capacitive coupling probe 16 operate as a series resonator to determine the resonant frequencies of oscillation in much the same manner that a crystal operates in oscillators designed for frequencies below the high microwave range. Cavity 19 acts as an inductor and capacitive coupling probe 16 acts as a capacitor. The resonant frequency obtained from coaxial cavity 19 is then amplified by FET 44 and transmitted to output connector 60. Unwanted resonant frequencies are removed by stabilization quarter-wave line 78 and stabilization resistor 48 Stabilization quarter-wave line 78 exhibits high impedence at the determined resonant frequency of oscillation and the resonant frequency never encounters stabilization resistor 48. However, stabilization quarter-wave line 78 exhibits low impedence when unwanted frequencies of oscillation are present, and such frequencies are down-loaded by stabilization resistor 48 and subsequently grounded out at stabilization ground 66. Thus, only desired frequencies of oscillation are amplified and transmitted to output connector 60. DC bias inductance 76 and DC bias capacitance C3 operate together to create a high impedance at resonant frequency. Similarly, RFC impedance 74 and RFC capacitance C2 create a high impedance at resonant frequency. DC blocking capacitor 58 keeps bias signals from entering output 60 In the preferred embodiment, the capacitance of FET capacitance C1, RFC capacitance C2, and DC bias capacitance C3 is on the order of 0.2 pF.

In its preferred embodiment, oscillator 10 operates within a frequency range of 9.0 to 10.5 GH$_z$. Its power output is sufficient to supply 9.0 to 10.5 GH$_z$ without expensive multipliers, whereas the prior art miniature cavities of equivalent size have outputs of approximately 1.5 GH$_z$ and must be coupled to multipliers Thus, an inexpensive, miniature microstrip/cavity oscillator that can be mechanically tuned over a wide range of microwave frequencies and compensates for changes in temperature has been described While the invention has been described in conjunction with specific embodiments thereof, it is evident that many alternatives, modifications, and variations will be apparent to those skilled in the art in light of the foregoing description. Accordingly, the invention is intended to embrace all such alternatives, modifications, and variations as fall within the spirit and broad scope of the appended claims.

I claim:

1. A miniature microstrip cavity oscillator which is mechanically tunable over a wide range of microwave frequencies and maintains high frequency stability over changes in temperature, said oscillator comprising:

a resonant frequency determining element constructed of a plurality of predetermined materials having different coefficients of linear expansion, said resonant frequency determining element comprising a housing member, said housing member being substantially hollow and having an open end; a plate enclosing said open end of said housing member, said plate having an outer face and an inner face; a cantilever member fixedly attached to a central area of said inner face of said cover plate; a threaded bore extending concentrically through said cantilever member and said cover plate; a mechanical tuning screw inserted in said threaded bore, said tuning screw having a slot on one end for mechanically adjusting said tuning screw and a center conductor fixedly attached to an opposite end of said tuning screw; and first fastening means for attaching said cover plate to said housing member;

a microstrip circuit board including circuit means for creating a positive feedback signal for a resonant frequency of oscillation determined within said resonant frequency determining element, for amplifying said resonant frequency, and for eliminating unwanted stable frequencies of oscillation; second fastening means attaching said microstrip circuit board to said resonant frequency determining element; and a capacitive coupling probe suspended in said resonant frequency determining element, said capacitive coupling probe coupling said circuit means to said resonant frequency determining element.

2. A miniature microstrip cavity oscillator as in claim 1 wherein said housing member and said plate are constructed of aluminum, said center conductor is constructed of brass, and said tuning screw is constructed of "INVAR".

3. A miniature microstrip cavity oscillator as in claim 1 wherein said circuit means comprises:

field effect transistor (FET) means for creating said positive feedback signal and amplifying said resonant frequency, said FET means coupled to said capacitive coupling probe;

stabilization means for loading down and grounding out said unwanted stable frequencies of oscillation from said FET means and said resonant frequency determining element;

bias means for biasing said FET means; and an output connected in series with said FET means.

* * * * *